(12) United States Patent
Shibata et al.

(10) Patent No.: US 12,424,526 B2
(45) Date of Patent: Sep. 23, 2025

(54) SEMICONDUCTOR DEVICE AND POWER CONVERSION DEVICE

(71) Applicant: Mitsubishi Electric Corporation, Tokyo (JP)

(72) Inventors: Shogo Shibata, Tokyo (JP); Shuhei Yokoyama, Tokyo (JP); Naoki Ikeda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 574 days.

(21) Appl. No.: 17/828,886

(22) Filed: May 31, 2022

(65) Prior Publication Data

US 2023/0163052 A1 May 25, 2023

(30) Foreign Application Priority Data

Nov. 25, 2021 (JP) .................................. 2021-191283

(51) Int. Cl.
*H01L 23/495* (2006.01)
*H01L 23/31* (2006.01)
*H02P 27/08* (2006.01)

(52) U.S. Cl.
CPC .... *H01L 23/49562* (2013.01); *H01L 23/3107* (2013.01); *H01L 23/4952* (2013.01);
(Continued)

(58) Field of Classification Search
CPC ........... H01L 23/49562; H01L 23/3107; H01L 23/4952; H01L 23/49568; H01L 23/49575;
(Continued)

(56) References Cited

U.S. PATENT DOCUMENTS

2019/0198431 A1   6/2019 Zhang et al.
2021/0036700 A1*  2/2021 Ishimatsu ............... H02M 7/48
(Continued)

FOREIGN PATENT DOCUMENTS

JP   2013-021227 A   1/2013
JP   2014-154780 A   8/2014
(Continued)

OTHER PUBLICATIONS

An Office Action mailed by the Japan Patent Office on Sep. 17, 2024, which corresponds to Japanese Patent Application No. 2021-191283 and is related to U.S. Appl. No. 17/828,886; with English translation.

(Continued)

*Primary Examiner* — Steven B Gauthier
*Assistant Examiner* — Adam D Weiland
(74) *Attorney, Agent, or Firm* — Studebaker Brackett PLLC

(57) ABSTRACT

The plurality of control terminals are drawn out from the first side surface of the sealing resin. The plurality of main terminals are drawn out from the second side surface of the sealing resin. Each of the main terminals includes, in the sealing resin, a bonding section wire-connected to one of the semiconductor chips, a heat transfer section adjacent to the bonding section, and a mounting section on which the other one of the semiconductor chips is mounted. A concave section is provided on the second side surface between the main terminals adjacent to each other. A side surface of the heat transfer section is opposed to the concave section. A side surface of the bonding section is not opposed to the concave section.

15 Claims, 3 Drawing Sheets

(52) U.S. Cl.
CPC .. *H01L 23/49568* (2013.01); *H01L 23/49575* (2013.01); *H02P 27/08* (2013.01)

(58) Field of Classification Search
CPC . H01L 23/28–3192; H01L 23/42–4338; H01L 23/60–62; H01L 23/49503–49513; H01L 21/56–568; H01L 2924/181–186; H02P 27/08
See application file for complete search history.

(56) References Cited

U.S. PATENT DOCUMENTS

| | | |
|---|---|---|
| 2021/0217687 A1 | 7/2021 | Takeuchi et al. |
| 2021/0217741 A1 | 7/2021 | Ishimatsu et al. |
| 2021/0358830 A1* | 11/2021 | Sato .................... H01L 24/41 |
| 2023/0142930 A1* | 5/2023 | McPherson ........... H02M 7/003 257/668 |

FOREIGN PATENT DOCUMENTS

| | | |
|---|---|---|
| JP | 2018-073892 A | 5/2018 |
| JP | 2019-114640 A | 7/2019 |
| WO | 2019/244372 A1 | 12/2019 |
| WO | 2020/039466 A1 | 2/2020 |

OTHER PUBLICATIONS

An Office Action issued by the German Patent and Trademark Office on Jan. 13, 2025, which corresponds to German Patent Application No. 102022124032.0 and is related to U.S. Appl. No. 17/828,886.
"Decision of Refusal" Office Action issued in JP 2021-191283; mailed by the Japanese Patent Office on Feb. 4, 2025.

* cited by examiner

SEMICONDUCTOR DEVICE AND POWER CONVERSION DEVICE

BACKGROUND OF THE INVENTION

Field

The present disclosure relates to a semiconductor device and a power conversion device.

Background

Sealing resin of a semiconductor device includes a first side surface and a second side surface opposed to each other. A plurality of control terminals to which a micro voltage is applied, such as signal terminals, are drawn out from the first side surface, and a plurality of main terminals to which a high voltage is applied, such as output terminals, are drawn out from the second side surface (see, for example, JP 2019-114640 A (Patent Literature 1)).

SUMMARY

By providing a concave section on the second side surface of the sealing resin between the main terminals adjacent to each other, it is possible to secure a creepage distance between the main terminals adjacent to each other. However, bonding sections of the main terminals wire-bonded to a semiconductor chip are present on the inside of the sealing resin to be opposed to the second side surface between the main terminals adjacent to each other. Since the bonding sections to be wire-bonded cannot be reduced in size, a space where the concave section is provided cannot be secured in an inter-terminal region.

The present disclosure has been made in order to solve the problems described above and an object of the present disclosure is to obtain a semiconductor device and a power conversion device that can be reduced in size.

A semiconductor device according to the present disclosure includes: a plurality of semiconductor chips; a plurality of control terminals connected to the plurality of semiconductor chips; a plurality of main terminals connected to the plurality of semiconductor chips and having larger width than the control terminals; and sealing resin sealing the plurality of semiconductor chips, parts of the plurality of control terminals, and parts of the plurality of main terminals, wherein the sealing resin is rectangular in a plan view and includes a first side surface and a second side surface opposed to each other, the plurality of control terminals are drawn out from the first side surface of the sealing resin, the plurality of main terminals are drawn out from the second side surface of the sealing resin, each of the main terminals includes, in the sealing resin, a bonding section wire-connected to one of the semiconductor chips, a heat transfer section adjacent to the bonding section, and a mounting section on which the other one of the semiconductor chips is mounted, a concave section is provided on the second side surface between the main terminals adjacent to each other, a side surface of the heat transfer section is opposed to the concave section, and a side surface of the bonding section is not opposed to the concave section.

In the present disclosure, the bonding section is not disposed and the heat transfer section is disposed in a region opposed to the second side surface between the main terminals adjacent to each other. Since the width of the heat transfer section not to be wire-bonded can be reduced, a space where the concave section is provided can be secured in a region between the main terminals adjacent to each other. A creepage distance can be secured even if the interval between the main terminals adjacent to each other is reduced by the depth of the concave section on the second side surface. Therefore, a product can be reduced in size by reducing a pitch.

Other and further objects, features and advantages of the invention will appear more fully from the following description.

DESCRIPTION OF EMBODIMENTS

A semiconductor device and a power conversion device according to the embodiments of the present disclosure will be described with reference to the drawings. The same components will be denoted by the same symbols, and the repeated description thereof may be omitted.

First Embodiment

Figure 1:
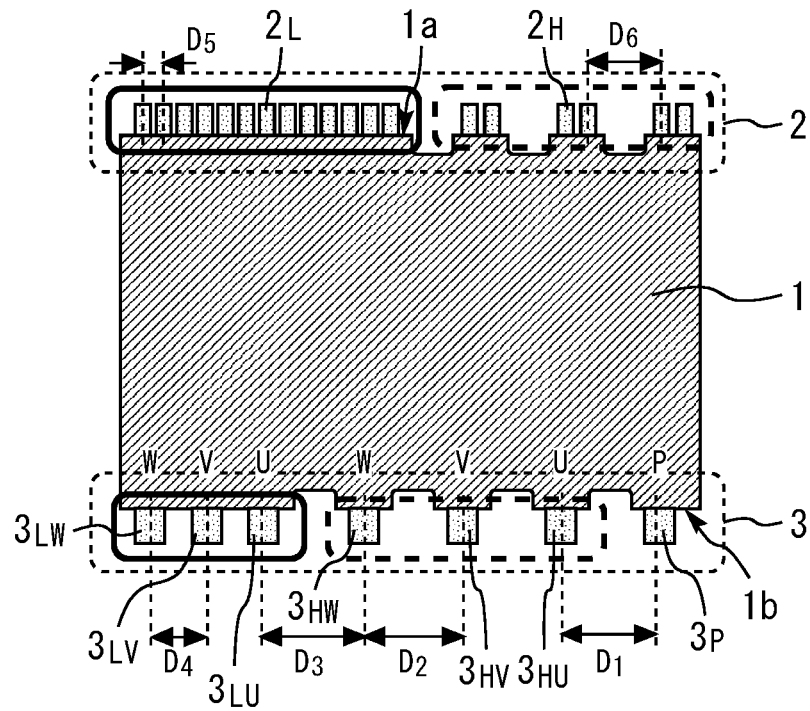
FIG. 1 is a plan view illustrating a semiconductor device according to a first embodiment.

FIG. 1 is a plan view illustrating a semiconductor device according to a first embodiment. The semiconductor device is a three-phase inverter. Sealing resin 1 is rectangular in a plan view and includes a first side surface 1$a$ and a second side surface 1$b$ opposed to each other. A plurality of control terminals 2 are drawn out from the first side surface 1$a$ of the sealing resin 1. A plurality of main terminals 3 are drawn out from the second side surface 1$b$ of the sealing resin 1. The main terminals 3 have larger width than the control terminals 2. Specifically, it is desirable that the width of the control terminals 2 is 0.65±0.2 mm and the width of the main terminals 3 is 2±0.2 mm in root portions projecting from the sealing resin 1.

The plurality of control terminals 2 include a plurality of high-side control terminals $2_H$ and a plurality of low-side control terminals $2_L$. Higher potential is applied to the high-side control terminals $2_H$ than the low-side control terminals $2_L$. The plurality of main terminals 3 include a P main terminal $3_P$, three high-side main terminals $3_{HU}$, $3_{HV}$, and $3_{HW}$, and three low-side main terminals $3_{LU}$, $3_{LV}$, and $3_{LW}$. Higher potential is applied to the high-side main terminals $3_{HU}$, $3_{HV}$, and $3_{HW}$ than the low-side main terminals $3_{LU}$, $3_{LV}$, and $3_{LW}$. The P main terminal $3_P$, the high-side main terminals $3_{HU}$, $3_{HV}$, and $3_{HW}$, and the low-side main terminals $3_{LU}$, $3_{LV}$, and $3_{LW}$ are disposed side by side in order on the second side surface 1$b$.

The high-side main terminals $3_{HU}$, $3_{HV}$, and $3_{HW}$ respectively correspond to a U phase, a V phase, and a W phase of a three-phase inverter. The low-side main terminals $3_{LU}$, $3_{LV}$, and $3_{LW}$ respectively correspond to the U phase, the V phase, and the W phase. The three-phase terminals may be arranged freely in order. For example, the three-phase terminals may be arranged in the order of the U, V, and W phases, may be arranged in the order of the U, W, and V phases, or may be arranged in the order of the W, V, and U phases. It is desirable to dispose the high-side main terminals $3_{HU}$, $3_{HV}$, and $3_{HW}$ and the low-side main terminals $3_{LU}$, $3_{LV}$, and $3_{LW}$ in the same arrangement order. However, it is unnecessary to always dispose the high-side main terminals $3_{HU}$, $3_{HV}$, and $3_{HW}$ and the low-side main terminals $3_{LU}$, $3_{LV}$, and $3_{LW}$ in the same arrangement order.

Figure 2:
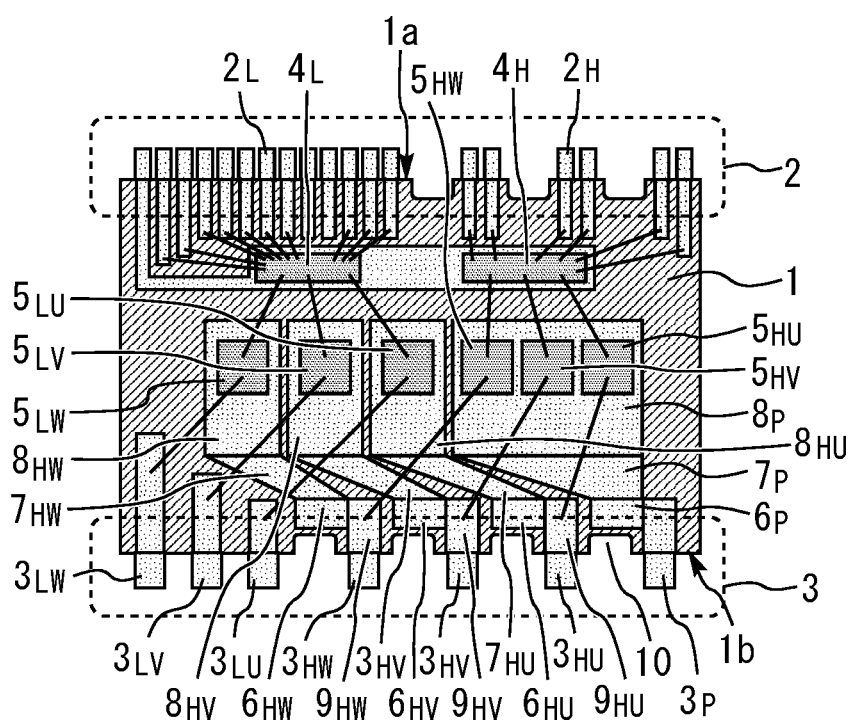
FIG. 2 is a plan view illustrating the inside of the semiconductor device according to the first embodiment.

FIG. 2 is a plan view illustrating the inside of the semiconductor device according to the first embodiment. A control chip $4_H$ is wire-connected to the plurality of high-side control terminals $2_H$. Gate electrodes of semiconductor chips $5_{HU}$, $5_{HV}$, and $5_{HW}$ are wire-connected to the control chip $4_H$. The control chip $4_H$ controls the semiconductor chips $5_{HU}$, $5_{HV}$, and $5_{HW}$ respectively according to signals input from the high-side control terminals $2_H$. A control chip $4_L$ is wire-connected to the plurality of low-side control terminals $2_L$. Gate electrodes of semiconductor chips $5_{LU}$, $5_{LV}$, and $5_{LW}$ are connected to the control chip $4_L$. The control chip $4_L$ controls the semiconductor chips $5_{LU}$, $5_{LV}$, and $5_{LW}$ respectively according to signals input from the low-side control terminals $2_L$. Note that the control chips $4_H$ and $4_L$ can be configured as one control chip. The control chips $4_H$ and $4_L$ may be bonded to a mounting section of a lead frame formed integrally with the plurality of control terminals 2.

The sealing resin 1 seals the control chips $4_H$ and $4_L$, the semiconductor chips $5_{HU}$, $5_{HV}$, $5_{HW}$, $5_{LU}$, $5_{LV}$, and $5_{LW}$, a part of the plurality of control terminals 2, and a part of the plurality of main terminals 3. The P main terminal $3_P$ includes, on the inside of the sealing resin 1, a heat transfer section $6_P$ and a mounting section $8_P$ connected to the heat transfer section $6_P$ via a connecting section $7_P$.

The high-side main terminal $3_{HU}$ includes, on the inside of the sealing resin 1, a bonding section $9_{HU}$, a heat transfer section $6_{HU}$ adjacent to the bonding section $9_{HU}$, and a mounting section $8_{HU}$ connected to the heat transfer section $6_{HU}$ via a connecting section $7_{HU}$. Portions of the high-side main terminal $3_{HU}$ drawn out to the outside of the sealing resin 1, that is, the bonding section $9_{HU}$, the heat transfer section $6_{HU}$, the connecting section $7_{HU}$, and the mounting section $8_{HU}$ are configured by a wire called integrated lead frame. These portions form a path for feeding a main current. The lead frame is made of, for example, a copper material.

Similarly, the high-side main terminal $3_{HV}$ includes, on the inside of the sealing resin 1, a bonding section $9_{HV}$, a heat transfer section $6_{HV}$ adjacent to the bonding section $9_{HV}$, and a mounting section $8_{HV}$ connected to the heat transfer section $6_{HV}$ via a connecting section $7_{HV}$. The high-side main terminal $3_{HW}$ includes, on the inside of the sealing resin 1, a bonding section $9_{HW}$, a heat transfer section $6_{HW}$ adjacent to the bonding section $9_{HW}$, and a mounting section $8_{HW}$ connected to the heat transfer section $6_{HW}$ via the connecting section $7_{HW}$.

Lower surface electrodes of the semiconductor chips $5_{HU}$, $5_{HV}$, and $5_{HW}$ are bonded to the mounting section $8_P$ of the P main terminal $3_P$ by soldering or the like. Lower surface electrodes of the semiconductor chips $5_{LU}$, $5_{LV}$, and $5_{LW}$ are respectively bonded to the mounting sections $8_{HU}$, $8_{HV}$, and $8_{HW}$ of the high-side main terminals $3_{HU}$, $3_{HV}$, and $3_{HW}$ by soldering or the like. Upper surface electrodes of the semiconductor chips $5_{HU}$, $5_{HV}$, and $5_{HW}$ are respectively wire-connected to the bonding sections $9_{HU}$, $9_{HV}$, and $9_{HW}$ of the high-side main terminals $3_{HU}$, $3_{HV}$, and $3_{HW}$. Upper surface electrodes of the semiconductor chips $5_{LU}$, $5_{LV}$, and $5_{LW}$ are respectively wire-connected to the low-side main terminals $3_{LU}$, $3_{LV}$, and $3_{LW}$.

At least four concave sections 10 are provided on the second side surface 1b of the sealing resin 1 between the main terminals 3 adjacent to each other. Specifically, one concave section 10 is provided between the P main terminal $3_P$ and the high-side main terminal $3_{HU}$ adjacent to each other, two concave sections 10 are provided among the high-side main terminals $3_{HU}$, $3_{HV}$, and $3_{HW}$ adjacent to one another, and one concave section 10 is provided between the high-side main terminal $3_{HW}$ and the low-side main terminal $3_{LU}$ adjacent to each other. Note that, since a creepage distance necessary among the low-side main terminals $3_{LU}$, $3_{LV}$, and $3_{LW}$, to which a high voltage is not applied, is small, the concave sections 10 are not provided among the low-side main terminals $3_{LU}$, $3_{LV}$, and $3_{LW}$ for a reduction in the size of the device.

Side surfaces of the heat transfer sections $6_P$, $6_{HU}$, $6_{HV}$, and $6_{HW}$ are opposed to bottom surfaces of the concave sections 10. That is, the heat transfer sections $6_P$, $6_{HU}$, $6_{HV}$, and $6_{HW}$ are adjacent to the concave sections 10 of the sealing resin 1. Heat generated in the semiconductor chips $5_{HU}$, $5_{HV}$, $5_{HW}$, $5_{LU}$, $5_{LV}$, and $5_{LW}$ by energization are respectively transferred to the heat transfer sections $6_P$, $6_{HU}$, $6_{HV}$, and $6_{HW}$ via the mounting sections $8_P$, $8_{HU}$, $8_{HV}$, and $8_{HW}$ and the connecting sections $7_P$, $7_{HU}$, $7_{HV}$, and $7_{HW}$. Since a heat transfer area is increased by the concave sections 10, the heats transferred to the heat transfer sections $6_P$, $6_{HU}$, $6_{HV}$, and $6_{HW}$ can be allowed to escape to the outside from the concave sections 10 by air cooling. Therefore, heat dissipation is improved. Note that side surfaces of the connecting sections $7_{HU}$, $7_{HV}$, and $7_{HW}$ are not opposed to the concave sections 10.

The bonding sections $9_{HU}$, $9_{HV}$, and $9_{HW}$ are respectively disposed on extended lines on which the high-side main terminals $3_{HU}$, $3_{HV}$, and $3_{HW}$ extend from the outside to the inside of the sealing resin 1. Side surfaces of the bonding sections $9_{HU}$, $9_{HV}$, and $9_{HW}$ are not opposed to the concave sections 10. The bonding section $9_{HU}$ and the heat transfer section $6_{HU}$ are connected in an L shape and are basically integrated. The width of the bonding section $9_{HU}$ is larger than the width of the heat transfer section $6_{HU}$ in a direction perpendicular to the second side surface 1b. Consequently, even when a wire extending from the semiconductor chip $5_{HU}$ is substantially perpendicularly connected to the wire bonding section $9_{HU}$, wire bonding can be sufficiently performed. The same applies to the bonding sections $9_{HV}$ and $9_{HW}$ and the heat transfer sections $6_{HV}$ and $6_{HW}$.

Figure 3:
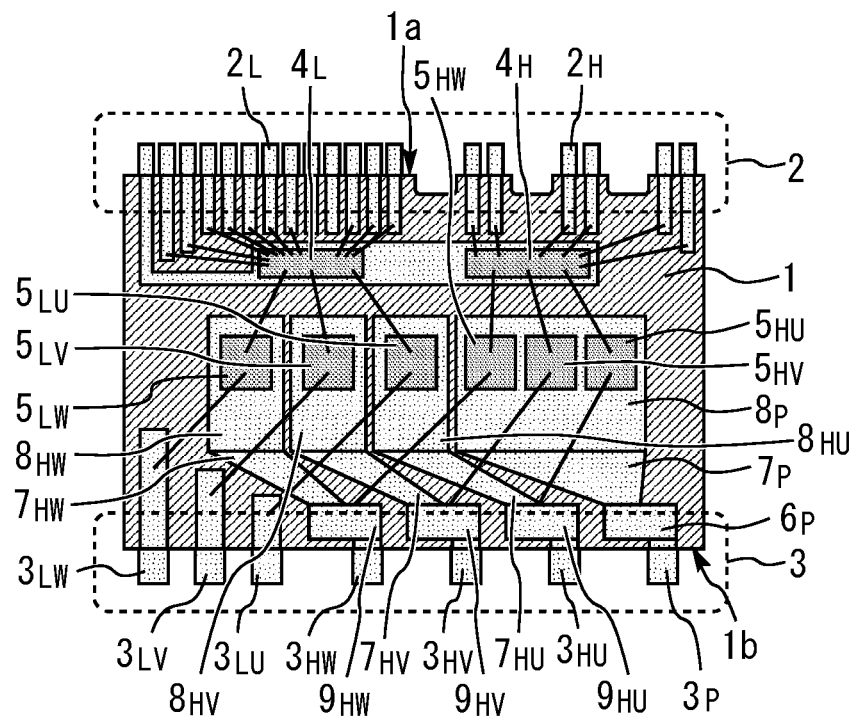
FIG. 3 is a plan view illustrating the inside of a semiconductor device according to the comparative example.

Subsequently, effects of this embodiment are explained in comparison with a comparative example. FIG. 3 is a plan view illustrating the inside of a semiconductor device according to the comparative example. In the comparative example, the bonding sections $9_{HU}$, $9_{HV}$, and $9_{HW}$ are provided to be opposed to the second side surface 1b between the main terminals 3 adjacent to each other. Since the bonding sections $9_{HU}$, $9_{HV}$, and $9_{HW}$ to be wire-bonded cannot be reduced in size, a space where the concave section 10 is provided cannot be secured in a region between the main terminals 3 adjacent to each other. Therefore, a creepage distance between the main terminals 3 adjacent to each other cannot be secured. It is necessary to increase the interval between the main terminals 3 adjacent to each other. Therefore, the device is increased in size.

In contrast, in this embodiment, the bonding sections $9_{HU}$, $9_{HV}$, and $9_{HW}$ are not disposed and the heat transfer sections $6_P$, $6_{HU}$, $6_{HV}$, and $6_{HW}$ are disposed in a region opposed to the second side surface 1b between the main terminals 3 adjacent to each other. Since the width of the heat transfer sections $6_P$, $6_{HU}$, $6_{HV}$, and $6_{HW}$ not to be wire-bonded can be reduced, a space where the concave section 10 is provided can be secured in a region between the main terminals 3 adjacent to each other. A creepage distance can be secured even if the interval between the main terminals 3 adjacent to each other is reduced by the depth of the concave section 10 on the second side surface 1b. Therefore, a product can be reduced in size by reducing a pitch. Not only a long side but also a short side of the sealing resin 1 can be reduced in size by reducing the width of the heat transfer sections $6_P$, $6_{HU}$, $6_{HV}$, and $6_{HW}$.

In FIG. 1, an interval $D_1$ between the P main terminal $3_P$ and the high-side main terminal $3_{HU}$ adjacent to each other is 4±0.2 mm. An interval $D_2$ among the high-side main terminals $3_{HU}$, $3_{HV}$, and $3_{HW}$ adjacent to one another is 6.1±0.2 mm. An interval $D_3$ between the high-side main terminal $3_{HW}$ and the low-side main terminal $3_{LU}$ adjacent to each other is 6.1±0.2 mm. An interval $D_4$ among the low-side main terminals $3_{LU}$, $3_{LV}$, and $3_{LW}$ adjacent to one another is 3.5±0.2 mm. Since a high potential difference occurs between the P main terminal $3_P$ and the high-side main terminals $3_{HU}$, $3_{HV}$, and $3_{HW}$ adjacent to each other, the intervals $D_1$, $D_2$, and $D_3$ on the high-side side are set larger than the interval $D_4$ on the low-side side. The interval between the terminals adjacent to each other indicates the interval between the center lines in a plan view of the terminals adjacent to each other.

As illustrated in FIG. 1, the P main terminal $3_P$, the high-side main terminals $3_{HU}$, $3_{HV}$, and $3_{HW}$, and the low-side main terminals $3_{LU}$, $3_{LV}$, and $3_{LW}$ are disposed in this order on the second side surface 1b. Not only this, but the P main terminal $3_P$, the low-side main terminals $3_{LU}$, $3_{LV}$, and $3_{LW}$, and the high-side main terminals $3_{HU}$, $3_{HV}$, and $3_{HW}$ may be disposed in this order on the second side surface 1b. In this case, one concave section 10 is provided between the P main terminal $3_P$ and the low-side main terminal $3_{LU}$ adjacent to each other, two concave sections 10 are provided among the high-side main terminals $3_{HU}$, $3_{HV}$, and $3_{HW}$ adjacent to one another, and one concave section 10 is provided between the low-side main terminal $3_{LW}$ and the high-side main terminal $3_{HU}$ adjacent to each other. However, since the low-side main terminals $3_{LU}$, $3_{LV}$, and $3_{LW}$ having low potential are disposed next to the P main terminal $3_P$ having high potential, insulation is slightly more difficult compared with when the main terminals are disposed in the order illustrated in FIG. 1.

When an operating voltage of the semiconductor device is 560 to 630 V, a creepage distance among the high-side main terminals $3_{HU}$, $3_{HV}$, and $3_{HW}$ adjacent to one another needs to be secured 4 mm or more. Therefore, by providing the concave sections 10 having depth of 0.5 mm or more among the high-side main terminals $3_{HU}$, $3_{HV}$, and $3_{HW}$, the interval among the high-side main terminals $3_{HU}$, $3_{HV}$, and $3_{HW}$ adjacent to one another can be reduced to less than 4 mm. Consequently, it is possible to sufficiently implement a reduction in the size of the semiconductor device.

As a voltage applied to terminals is higher, it is necessary to set the interval between the terminals larger and set the width of the terminals larger. When an applied voltage is the same, the interval is set larger as the terminal width is larger. Specifically, an interval $D_5$ between the low-side control terminals $2_L$ adjacent to each other is smaller than the interval $D_4$ among the low-side main terminals $3_{LU}$, $3_{LV}$, and $3_{LW}$ adjacent to one another. An interval $D_6$ between the high-side control terminals $2_H$ adjacent to each other is smaller than the interval $D_1$ between the P main terminal $3_P$ and the high-side main terminal $3_{HU}$ adjacent to each other and the interval $D_2$ among the high-side main terminals $3_{HU}$, $3_{HV}$, and $3_{HW}$ adjacent to one another and is larger than the interval $D_4$ among the low-side main terminals $3_{LU}$, $3_{LV}$, and $3_{LW}$ adjacent to one another. That is, $D_5<D_4<D_6<D_1$, $D_2$. A reduction in the size of the entire semiconductor device is enabled by a combination of optimization of the terminal intervals and the concave sections 10.

The interval of the P main terminal $3_P$ and the high-side main terminal $3_{HU}$ adjacent to each other is equal to or larger than the interval between the other main terminals 3 adjacent to each other and the interval between the control terminals 2 adjacent to each other. By setting the interval between the P main terminal $3_P$ and the high-side main terminal $3_{HU}$ adjacent to each other the largest in this way, an insulation distance can be secured even if the P main terminal $3_P$ is increased in thickness. That is, since the P main terminal $3_P$ can be increased in thickness, design flexibility is increased.

Figure 4:
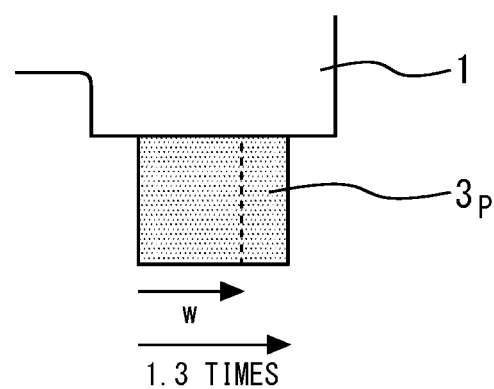
FIG. 4 is an enlarged view of a P terminal.

FIG. 4 is an enlarged view of a P terminal. An electric current 1.4 times as large as an electric current flowing to the other terminals 3 sometimes flows to the P main terminal $3_P$. Therefore, the width of the P main terminal $3_P$ is set larger than the width of the main terminals 3 other than the P main terminal $3_P$ and the width of the control terminals 2. The width of the P main terminal $3_P$ is desirably equal to or larger than 1.3 times of width w of the other main terminals 3. Since heat is not transferred to the P main terminal $3_P$ via a wire, the P main terminal $3_P$ has a sufficient temperature reducing effect at this width. Specifically, in root portions projecting from the sealing resin 1, the width of the P main terminal $3_P$ is set to 2.6±0.2 mm, the width of the main terminals 3 other than the P main terminal $3_P$ is set to 2±0.2 mm, and the width of the control terminals 2 is set to 0.65±0.2 mm. Consequently, it is possible to suppress self-heat generation of the P main terminal $3_P$ to which an energization current flows most, and further reduce a terminal temperature rise.

Second Embodiment

Figure 5:
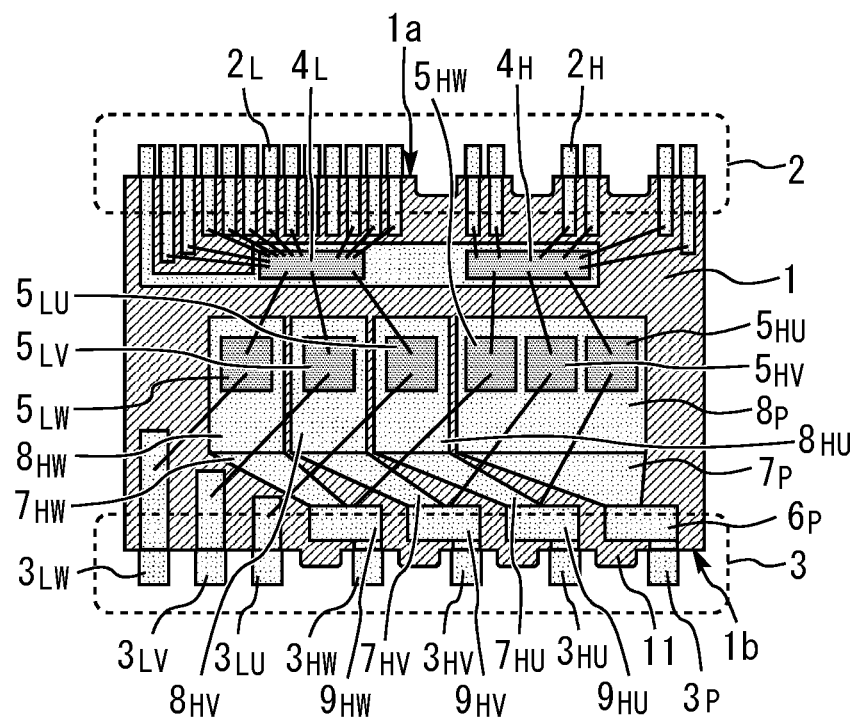
FIG. 5 is a plan view illustrating the inside of a semiconductor device according to a second embodiment.

FIG. 5 is a plan view illustrating the inside of a semiconductor device according to a second embodiment. In the first embodiment, the concave section 10 is provided on the second side surface 1b between the main terminals 3 adjacent to each other. However, in this embodiment, a convex section 11 is provided instead of the concave section 10. A creepage distance can be secured even if the interval between the main terminals 3 adjacent to each other is reduced by the height of the convex section 11 on the second side surface 1b. Therefore, a product can be reduced in size by reducing a pitch.

Formation of the convex sections 11 is not hindered even if the wide bonding sections $9_{HU}$, $9_{HV}$, and $9_{HW}$ are disposed among the main terminals 3 adjacent to one another. Therefore, the heat transfer sections $6_{HU}$, $6_{HV}$, and $6_{HW}$ can be omitted and the bonding sections $9_{HU}$, $9_{HV}$, and $9_{HW}$ can be made adjacent to the convex sections 11. Heats generated in the semiconductor chips $5_{LU}$, $5_{LV}$, and $5_{LW}$ by energization are transferred to the bonding sections $9_{HU}$, $9_{HV}$, and $9_{HW}$ via the mounting sections $8_{HU}$, $8_{HV}$, and $8_{HW}$ and the connecting sections $7_{HU}$, $7_{HV}$, and $7_{HW}$. Since a heat transfer area is increased by the convex sections 11, the heats transferred to the bonding sections $9_{HU}$, $9_{HV}$, and $9_{HW}$ can be allowed to escape to the outside from the convex sections 11 by air cooling. Note that the heat transfer sections $6_{HU}$, $6_{HV}$, and $6_{HW}$ may be provided as in the first embodiment and made adjacent to the convex sections 11.

When an operating voltage of the semiconductor device is 560 to 630 V, a creepage distance among the high-side main terminals $3_{HU}$, $3_{HV}$, and $3_{HW}$ adjacent to one another needs to be secured 4 mm or more. Therefore, by providing the convex sections 11 having projection height of 0.5 mm or more among the high-side main terminals $3_{HU}$, $3_{HV}$, and $3_{HW}$, the interval among the high-side main terminals $3_{HU}$, $3_{HV}$, and $3_{HW}$ adjacent to one another can be reduced to less than 4 mm. Consequently, it is possible to sufficiently implement a reduction in the size of the semiconductor device. The other components and effects are the same as those in the first embodiment.

Note that, in the first and second embodiments, a concave section or a convex section may be provided on the first side surface 1a between the control terminals 2 adjacent to each other. The semiconductor chips $5_{HU}$, $5_{HV}$, $5_{HW}$, $5_{LU}$, $5_{LV}$, and $5_{LW}$ are mounted on the lead frame. However, the semiconductor chips $5_{HU}$, $5_{HV}$, $5_{HW}$, $5_{LU}$, $5_{LV}$, and $5_{LW}$ may be mounted on an insulating substrate. The insulating substrate has a structure in which metal plates are stuck to both surfaces of an insulating layer. The semiconductor chips $5_{HU}$, $5_{HV}$, $5_{HW}$, $5_{LU}$, $5_{LV}$, and $5_{LW}$ are mounted on the metal plates. Wires are extended from heat transfer sections as in the lead frame. The wires are bonded to the metal plates by soldering or ultrasonic vibration.

The semiconductor chips $5_{HU}$, $5_{HV}$, $5_{HW}$, $5_{LU}$, $5_{LV}$, and $5_{LW}$ are RC-IGBTs obtained by integrating IGBTs and diodes into one chip. Accordingly, it is possible to reduce the semiconductor device in size compared with when the IGBTs and the diodes are individually mounted. Note that the IGBTs and the diodes may be individually mounted. In that case, three IGBTs and three diodes are mounted on the mounting section $8_P$ of the P main terminal $3_P$. One IGBT and one diode are mounted on each of the mounting sections $8_{HU}$, $8_{HV}$, and $8_{HW}$ of the high-side main terminals $3_{HU}$, $3_{HV}$, and $3_{HW}$.

The semiconductor chips $5_{HU}$, $5_{HV}$, $5_{HW}$, $5_{LU}$, $5_{LV}$, and $5_{LW}$ are not limited to semiconductor devices formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Third Embodiment

In this embodiment, the semiconductor devices according to the first or second embodiment described above are applied to an electric power conversion device. The electric power conversion device is, for example, an inverter device, a converter device, a servo amplifier, or a power supply unit. Although the present disclosure is not limited to a specific electric power conversion device, a case where the present disclosure is applied to a three-phase inverter will be described below.

Figure 6:
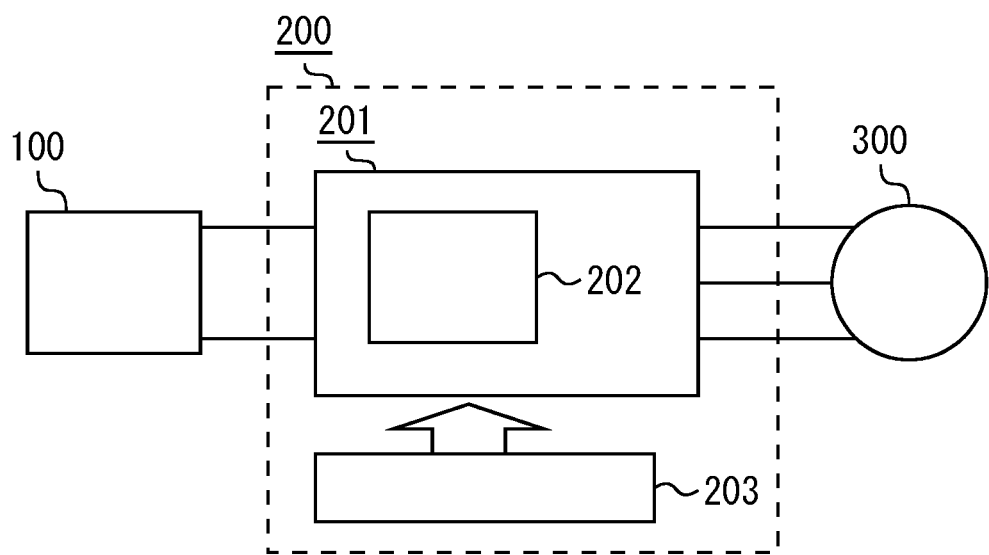
FIG. 6 is a block diagram illustrating a configuration of an electric power conversion system to which the electric power conversion device according to the third embodiment is applied.

FIG. 6 is a block diagram illustrating a configuration of an electric power conversion system to which the electric power conversion device according to the third embodiment is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor device 202 corresponding to the first or second embodiment described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor device 202. Another drive circuit different from the semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, the semiconductor device according to the first or second embodiment is applied as the semiconductor device 202. Accordingly, it is possible to miniaturization of the electric power conversion device.

While this embodiment illustrates an example in which the present disclosure is applied to a two-level three-phase inverter, the present disclosure is not limited to this and can be applied to various electric power conversion devices. While this embodiment illustrates a two-level electric power conversion device, the present disclosure can also be applied to a three-level or multi-level electric power conversion device. When power is supplied to a single-phase load, the present disclosure may be applied to a single-phase inverter. The present disclosure can also be applied to a DC/DC converter or an AC/DC converter when power is supplied to a DC load or the like.

Further, in the electric power conversion device to which the present disclosure is applied, the above-mentioned load is not limited to an electric motor. For example, the load may also be used as a power supply device for an electric discharge machine, a laser beam machine, an induction heating cooker, or a non-contact device power feeding system. More alternatively, the electric power conversion device may be used as a power conditioner for a photovoltaic power generating system, an electricity storage system, or the like.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-191283, filed on Nov. 25, 2021 including specification, claims, drawings and summary, on which the convention priority of the present application is based, is incorporated herein by reference in its entirety.

The invention claimed is:

1. A semiconductor device comprising:
a plurality of semiconductor chips;
a plurality of control terminals connected to the plurality of semiconductor chips;
a plurality of main terminals connected to the plurality of semiconductor chips and having larger width than the control terminals; and
sealing resin sealing the plurality of semiconductor chips, parts of the plurality of control terminals, and parts of the plurality of main terminals,
wherein the sealing resin is rectangular in a plan view and includes a first side surface and a second side surface opposed to each other,
the plurality of control terminals are drawn out from the first side surface of the sealing resin,
the plurality of main terminals are drawn out from the second side surface of the sealing resin,
each of the main terminals includes, in the sealing resin, a bonding section wire-connected to one of the semiconductor chips, a heat transfer section adjacent to the bonding section, and a mounting section on which an other one of the semiconductor chips is mounted,
a concave section is provided on the second side surface between the main terminals adjacent to each other,
a side surface of the heat transfer section is opposed to the concave section in a first direction extending from the first side surface to the second side surface,
the bonding section includes plural side surfaces,
one of the side surfaces of the bonding section is opposed to the concave section in a second direction perpendicular to the first direction, and
none of the side surfaces of the bonding section are opposed to the concave section in the first direction.

2. The semiconductor device according to claim 1, wherein the heat transfer section is not wire-bonded.

3. The semiconductor device according to claim 1, wherein a width of the bonding section is larger than a width of the heat transfer section in the first direction.

4. The semiconductor device according to claim 1, wherein the bonding section is disposed on an extended line on which the main terminal extends from an outside to an inside of the sealing resin.

5. The semiconductor device according to claim 1, wherein the plurality of main terminals include a plurality of high-side main terminals,
the semiconductor device further comprises a P main terminal and a plurality of low side main terminals,
an interval between the P main terminal and the high-side main terminal adjacent to each other and an interval among the high-side main terminals adjacent to one another are each larger than an interval among the low-side main terminals adjacent to one another, and
the concave section is provided between the P main terminal and the high-side main terminal adjacent to each other and among the high-side main terminals adjacent to one another.

6. The semiconductor device according to claim 5, wherein an operating voltage of the semiconductor device is 560 to 630 V,
the concave section has depth of 0.5 mm or more, and
the interval among the high-side main terminals adjacent to one another is less than 4 mm.

7. The semiconductor device according to claim 5, wherein the plurality of control terminals include a plurality of high-side control terminals and a plurality of low-side control terminals, an interval between the low-side control terminals adjacent to each other is smaller than the interval among the low-side main terminals adjacent to one another, and an interval between the high-side control terminals adjacent to each other is smaller than the interval between the P main terminal and the high-side main terminal adjacent to each other and the interval among the high-side main terminals adjacent to one another and is larger than the interval among the low-side main terminals adjacent to one another.

8. The semiconductor device according to claim 5, wherein the interval of the P main terminal and the high-side main terminal adjacent to each other is equal to or larger than each interval between the main terminals among the plurality of main terminals that are adjacent to each other and is equal to or larger than each interval between the control terminals that are adjacent to each other, and a width of the P main terminal is larger than a width of the main terminals and a width of the control terminals.

9. The semiconductor device according to claim 8, wherein a width of the P main terminal is equal to or larger than 1.3 times of a width of the other main terminal.

10. The semiconductor device according to claim 5, wherein the P main terminal, the plurality of high-side main terminals, and the plurality of low-side main terminals are disposed in this order on the second side surface.

11. The semiconductor device according to claim 1, wherein the semiconductor chips are RC-IGBTs having an IGBT and a diode integrated in one chip.

12. The semiconductor device according to claim 1, wherein the semiconductor chips are made of a wide-bandgap semiconductor.

13. An electric power conversion device comprising:

a main conversion circuit including the semiconductor device according to claim 1, converting input power and outputting converted power; and a control circuit outputting a control signal for controlling the main conversion circuit to the main conversion circuit.

14. The semiconductor device according to claim 1, wherein the plurality of main terminals each include a drawn out portion that is drawn out from the second side surface of the sealing resin, the heat transfer section is between the mounting section and the bonding section, and the bonding section is between the heat transfer section and the drawn out portion.

15. The semiconductor device according to claim 1, wherein the plurality of main terminals each include a drawn out portion that is drawn out from the second side surface of the sealing resin, the heat transfer section is entirely between the mounting section and the bonding section, and the bonding section is entirely between the heat transfer section and the drawn out portion.

* * * * *